United States Patent
Hsu (10) Patent No.: US 7,078,289 B2
(45) Date of Patent: Jul. 18, 2006

(54) METHOD FOR FABRICATING A DEEP TRENCH CAPACITOR OF DRAM DEVICE

(75) Inventor: Ping Hsu, Taipei Hsien (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 305 days.

(21) Appl. No.: 10/707,029

(22) Filed: Nov. 16, 2003

(65) Prior Publication Data
US 2005/0277242 A1  Dec. 15, 2005

(51) Int. Cl.
*H01L 21/8242* (2006.01)
(52) U.S. Cl. ............... 438/243; 438/386; 438/E29.436; 257/301; 257/303; 257/E21.651; 257/E27.092
(58) Field of Classification Search ...................... None
See application file for complete search history.

(56) References Cited
U.S. PATENT DOCUMENTS
6,436,760 B1 * 8/2002 Wong et al. ................ 438/243
6,815,307 B1 * 11/2004 Hsu et al. .................... 438/386

* cited by examiner

Primary Examiner—Dung A. Le
(74) Attorney, Agent, or Firm—Winston Hsu (57) ABSTRACT

A method for fabricating a deep trench capacitor of DRAM devices is disclosed. A substrate with a deep trench formed therein is provided. The trench is then doped to form a buried plate electrode serving as a first electrode of the deep trench capacitor at a lower portion of the deep trench. An isolation dielectric film is formed on interior surface of the deep trench. Subsequently, a first polysilicon layer is deposited on the isolation dielectric film to fill the deep trench. The first polysilicon layer is recessed to a first depth $d_1$ under the surface of the substrate. A thin silicon film is deposited on the recessed first polysilicon layer and also on the exposed isolation dielectric film. A anisotropic etching is carried out to etch the thin silicon film, the subjacent recessed first polysilicon layer to a second depth $d_2$ under the surface of the substrate. The remaining silicon film becomes a silicon spacer protecting the upper portion of the isolation dielectric film. The isolation dielectric film at the neck of the deep trench capacitor, which is not covered by the silicon spacer and the first polysilicon layer, is stripped off to expose the substrate.

9 Claims, 10 Drawing Sheets

METHOD FOR FABRICATING A DEEP TRENCH CAPACITOR OF DRAM DEVICE

BACKGROUND OF INVENTION

1. Field of the Invention

The present invention relates to a semiconductor process, and more particularly, to a process of manufacturing a deep trench capacitor of a DRAM device.

2. Description of the Prior Art

Trench-capacitor DRAM devices are known in the art. A trench-storage capacitor typically consists of a very-high-aspect-ratio contact-style hole pattern etched into the substrate, a thin storage-node dielectric insulator, a doped low-pressure chemical vapor deposition (LPCVD) polysilicon fill, and buried-plate diffusion in the substrate. The doped LPCVD silicon fill and the buried plate serve as the electrodes of the capacitor. A dielectric isolation collar in the upper region of the trench prevents leakage of the signal charge from the storage-node diffusion to the buried-plate diffusion of the capacitor.

In general, the prior art method for fabricating a trench capacitor of a DRAM device may include several major manufacture phases as follows:

Phase 1: deep trench etching.

Phase 2: buried plate and capacitor dielectric (or node dielectric) forming.

Phase 3: first polysilicon deep trench fill and first recess etching.

Phase 4: sidewall node dielectric etching.

Phase 5: collar oxide forming and etching.

Phase 6: second polysilicon deposition and second recess etching.

Phase 7: collar oxide wet etching (including an extra over-etching stage).

Phase 8: third polysilicon deposition and third recess etching.

Phase 9: shallow trench isolation (hereinafter referred to as "STI") forming.

Figure 1:
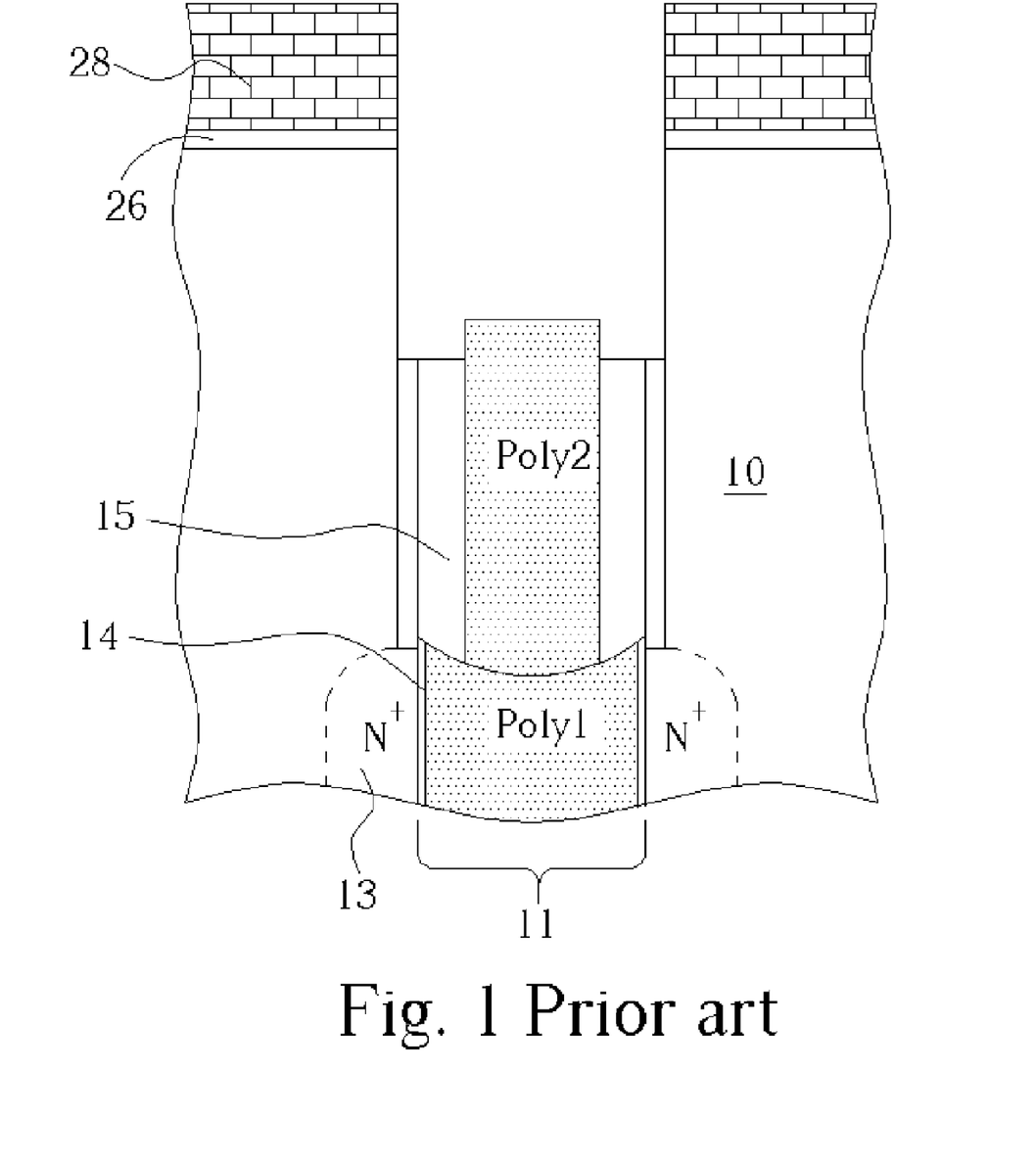
FIG. 1 and FIG. 2 are schematic cross-sectional diagrams showing several intermediate steps of forming a prior art deep trench capacitor (before STI process), which are relative to the present invention.
Figure 2:
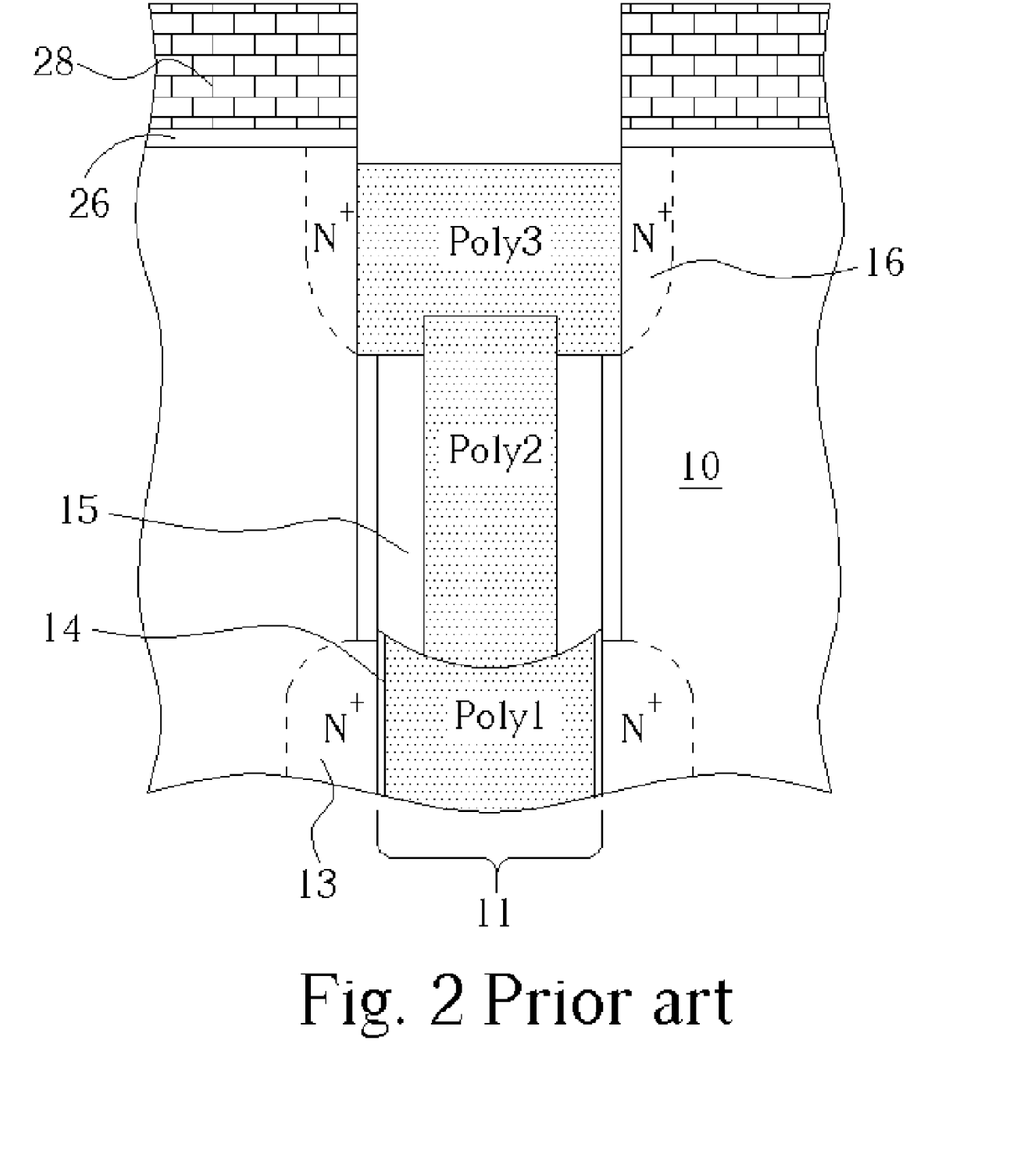

Please refer to FIG. 1 and FIG. 2. FIG. 1 and FIG. 2 are schematic cross-sectional diagrams showing several intermediate steps of forming a prior art deep trench capacitor (before STI process), which are relative to the present invention. As shown in FIG. 1, a substrate 10 having a pad oxide layer 26 and a pad nitride layer 28 thereon is provided. After deep trench etching, an N+ buried plate 13 and a node dielectric layer 14 are sequentially formed in the deep trench. A first polysilicon deposition and recess process is then carried out to form a first poly layer (Poly1) at the bottom of the deep trench. A collar oxide layer 15 is formed on sidewall of the deep trench above Poly1 . A second polysilicon deposition and recess process is then carried out to form a second poly layer (Poly2) atopPoly1. The collar oxide layer 15 that is not covered by Poly 2 is stripped off to expose the sidewall of the deep trench. Subsequently, as shown in FIG. 2, a third polysilicon deposition and recess process is carried out to form a third poly layer (Poly3) atopPoly2 and collar oxide layer 15. Dopants of the heavily doped Poly2 diffuse out through Poly3 to the surrounding substrate 10 to form an annular shaped buried strap out diffusion regions 16 in the following thermal process.

As the capacitor device area shrinks, the thickness of the collar oxide layer 15 has been adversely affected the fill ability of the second polysilicon layer (Poly2). Further, the shrinkage of the spacing for the second polysilicon layer (Poly2) also leads to increased storage node resistance, which will degrade device performance. Moreover, the prior art capacitor architecture encounters DT-AA misalignment problem. When deep trench capacitor-to-active area (DT-AA) misalignment occurs during the definition of active areas and STI, some capacitors might be disconnected from the access transistor thereof.

SUMMARY OF INVENTION

Accordingly, the primary object of the present invention is to provide a method for fabricating a deep trench capacitor and trench capacitor memory devices, which is capable of avoiding the above-mentioned problems.

According to the claimed invention, a method for fabricating a trench capacitor is disclosed. A substrate having a deep trench etched therein is provided. The deep trench is doped to form a buried plate electrode in the substrate adjacent to a lower portion of the deep trench. A node dielectric layer is formed on interior surface of the deep trench. A first polysilicon layer is deposited in the deep trench. The first polysilicon layer is then recessed to a first depth $d_1$ in the deep trench. A top surface of the recessed first polysilicon layer and the node dielectric layer constitutes a first recess. A silicon spacer layer is deposited in the first recess. The silicon spacer layer and the first polysilicon layer inside the deep trench are anistropic etched to a second depth $d_2$. The remaining silicon spacer layer becomes a spacer. The node dielectric layer that is not covered by the spacer and the first polysilicon layer is removed, thereby exposing a silicon surface at a neck portion of the deep trench. The node dielectric layer is divided into an upper dielectric section and a lower dielectric section that serves as a capacitor dielectric of the trench capacitor. The spacer, the silicon surface at the neck portion of the deep trench and an upper portion of the first polysilicon layer are oxidized, thereby forming a silicon oxide layer. The silidon oxide layer is then etched away.

It is to be understood that both the foregoing general description and the following detailed description are exemplary, but are not restrictive, of the invention. Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 3:
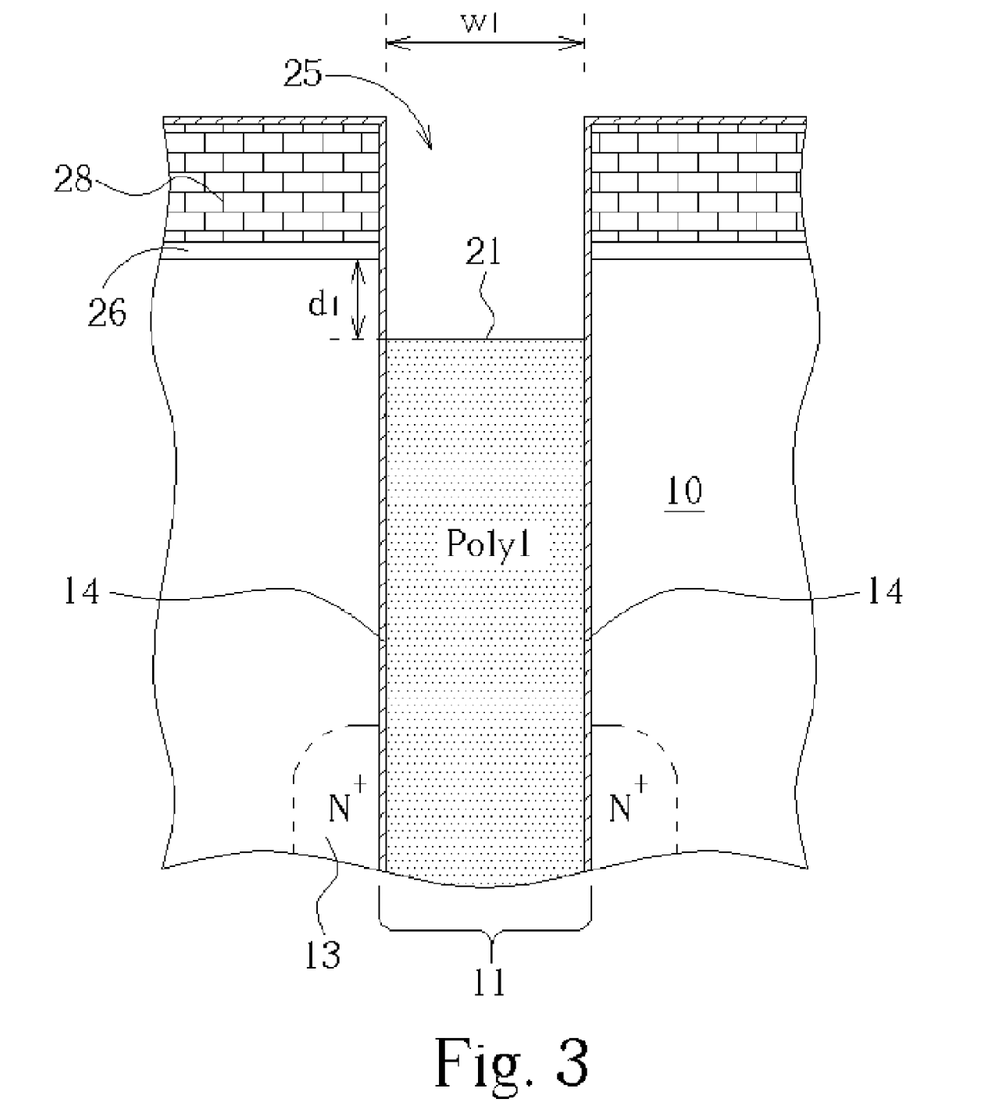
FIG. 3 to FIG. 10 are schematic cross-sectional diagrams illustrating the method for fabricating deep trench capacitor according to the preferred embodiment of the present invention.

Please refer to FIG. 3 to FIG. 10. FIG. 3 to FIG. 10 are schematic cross-sectional diagrams illustrating the method for fabricating deep trench capacitor according to the preferred embodiment of the present invention. As shown in FIG. 3, a semiconductor substrate 10 such as a silicon substrate is provided. The semiconductor substrate 10 has a main surface 11, on which a pad oxide layer 26 and a pad nitride layer 28 are sequentially formed. The pad oxide layer 26 may be grown to a thickness of about 50 angstroms or below by any suitable method known in the art, for example, thermal oxidation. The pad nitride layer may be formed by conventional chemical vapor deposition (CVD) methods. A photoresist layer (not shown) is then patterned on the pad nitride layer 28. The photoresist layer contains an opening (not shown) exposing the deep trench capacitor region to be defined in the substrate. Using the photoresist layer as an etching mask, a deep trench dry etching is then carried out to form a deep trench 11 in the substrate 10, which has a trench width $w_1$ and a trench depth of about 7 micrometers or deeper. The formation of a deep trench in a silicon substrate is known in the art. Dry etching such as RIE is typically used to form a deep trench in the semiconductor substrate 10. After removing the remaining photoresist, a buried plate 13 that is adjacent to a lower portion of the deep trench 11, and a node dielectric layer 14 are sequentially formed. The buried plate 13 serves as one electrode plate of the deep trench capacitor. The method of forming the buried plate 13 comprises the steps of depositing a thin layer of arsenic silicate glass (ASG) at a lower portion of the deep trench, followed by thermal drive in. It is understood that other doping methods such as gas phase doping (GPD) or the like may be employed. The node dielectric layer 14 may be oxide-nitride (ON) or oxide-nitride-oxide (ONO), but not limited thereto. A first polysilicon deposition and recess process is carried out to form a first polysilicon layer (Poly1) inside the deep trench 11. As specifically indicated in FIG. 3, the first polysilicon is recessed to first depth $d_1$ inside the deep trench 11, wherein $d_1$ ranges between 200 and 500 angstroms preferably. The node dielectric layer 14 inside the deep trench 11 and a top surface 21 of Poly1 constitute a first recess 25.

Figure 4:
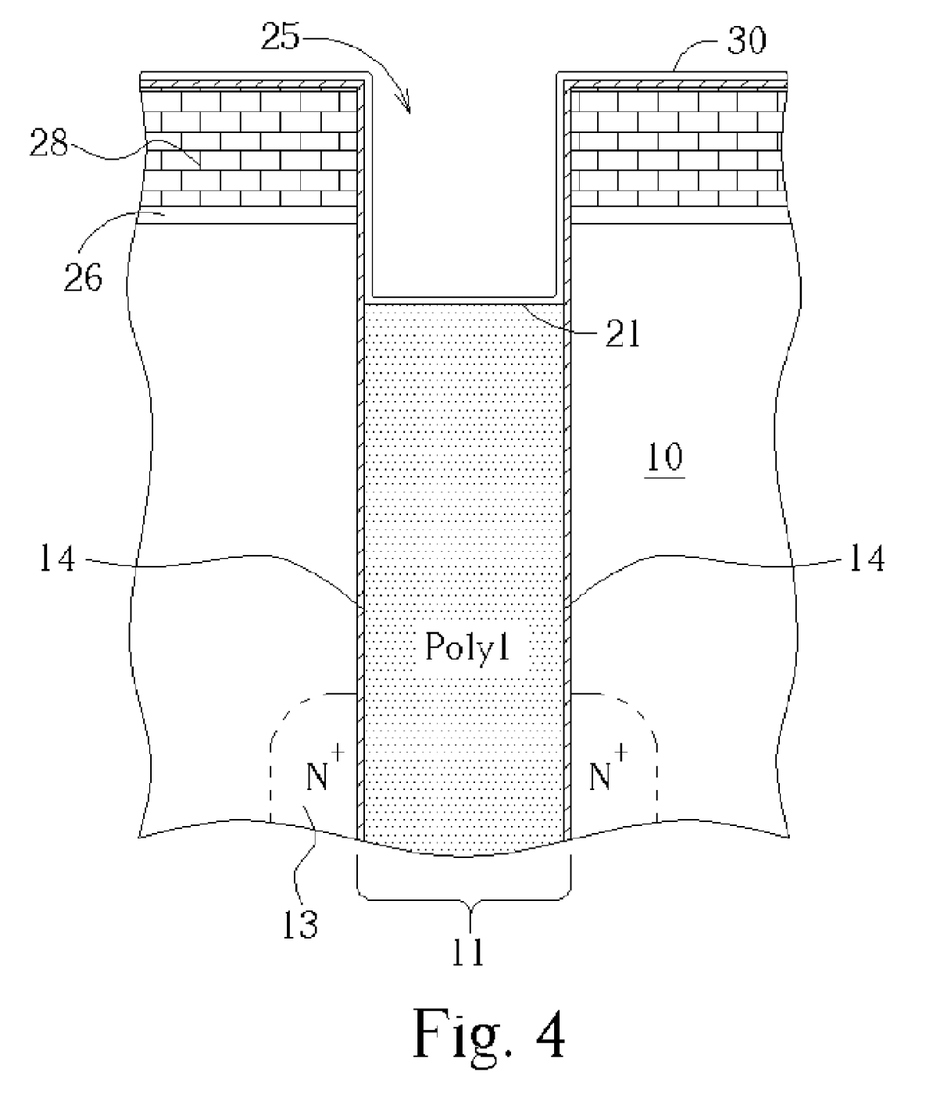

As shown in FIG. 4, a chemical vapor deposition (CVD) process such as low-pressure chemical vapor deposition (LPCVD) is carried out to deposit a silicon spacer layer 30 with a thickness of about 150~200 angstroms on the node dielectric layer 14, and on the top surface 21 of Poly1. The silicon spacer layer 30 may be made of amorphous silicon or polysilicon.

Figure 5:
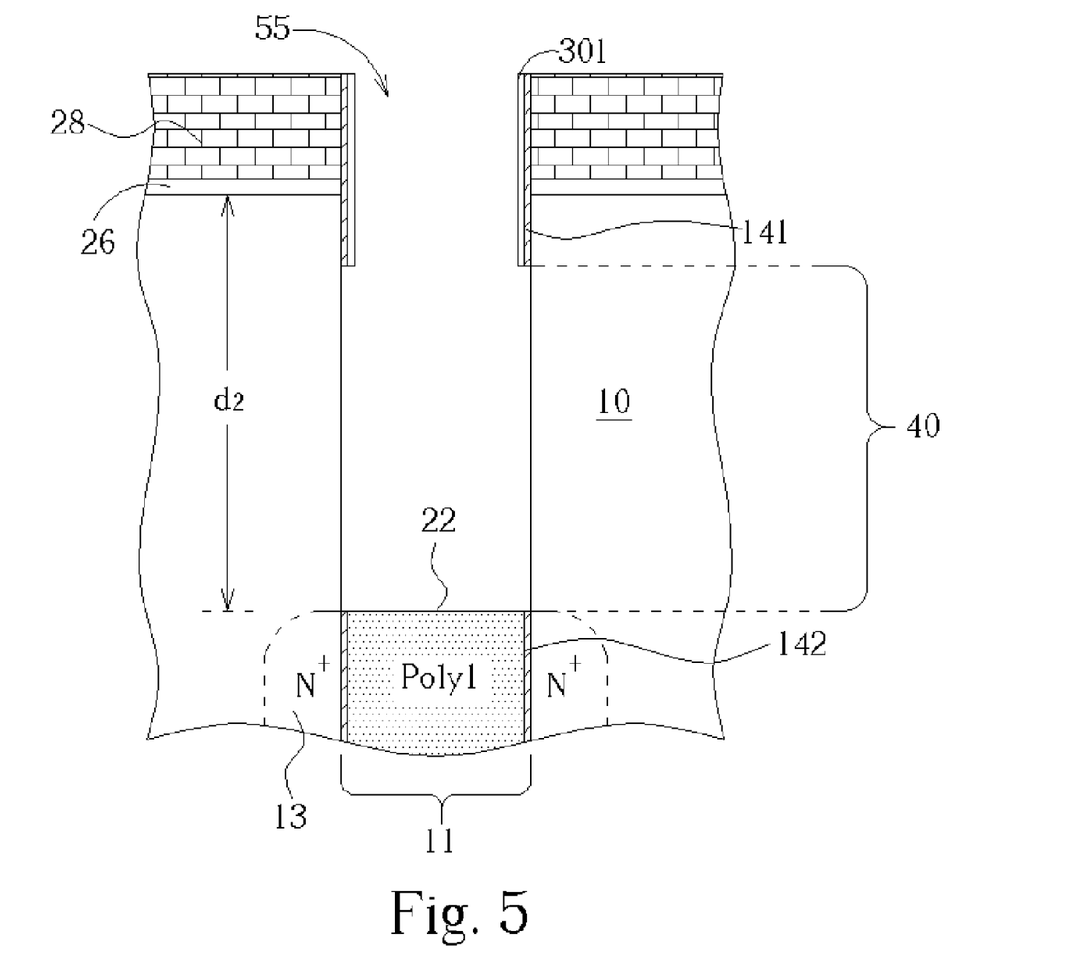

As shown in FIG. 5, using the pad nitride layer 28 as an etching stop layer, a dry etching is performed to etch the silicon spacer layer 30 above the pad nitride layer 28 and the silicon spacer layer 30 deposited on the top surface of Poly1. The dry etching continues to etch the node dielectric layer 14 above the pad nitride layer 28 and then etch Poly1 to a second depth $d_2$ inside the deep trench 11. According to the preferred embodiment of this invention, the second depth $d_2$ ranges between 800 and 1500 angstroms, more preferably 1000 angstroms. The remaining silicon spacer layer 30 now becomes a silicon spacer 301 on sidewall of the deep trench 11 for protecting the node dielectric layer 14. Subsequently, a wet etching is carried to remove the node dielectric layer 14 that is not covered by the silicon spacer 301, thereby exposing the silicon surface at the neck 40 (the interval between second depth $d_2$ and first depth $d_1$) of the deep trench 11. As best seen in FIG. 5, the node dielectric layer 14 is now divided into an upper dielectric section 141 and a lower dielectric section 142. The upper dielectric section 141 is used to protect the pad oxide layer 26 around the top of the deep trench 11. The lower dielectric section 142 serves as the capacitor dielectric of the deep trench capacitor. At this phase, the surface of the silicon spacer 301, the neck silicon surface of the deep trench, and a top surface 22 of Poly1 constitute a second recess 55.

Figure 6:
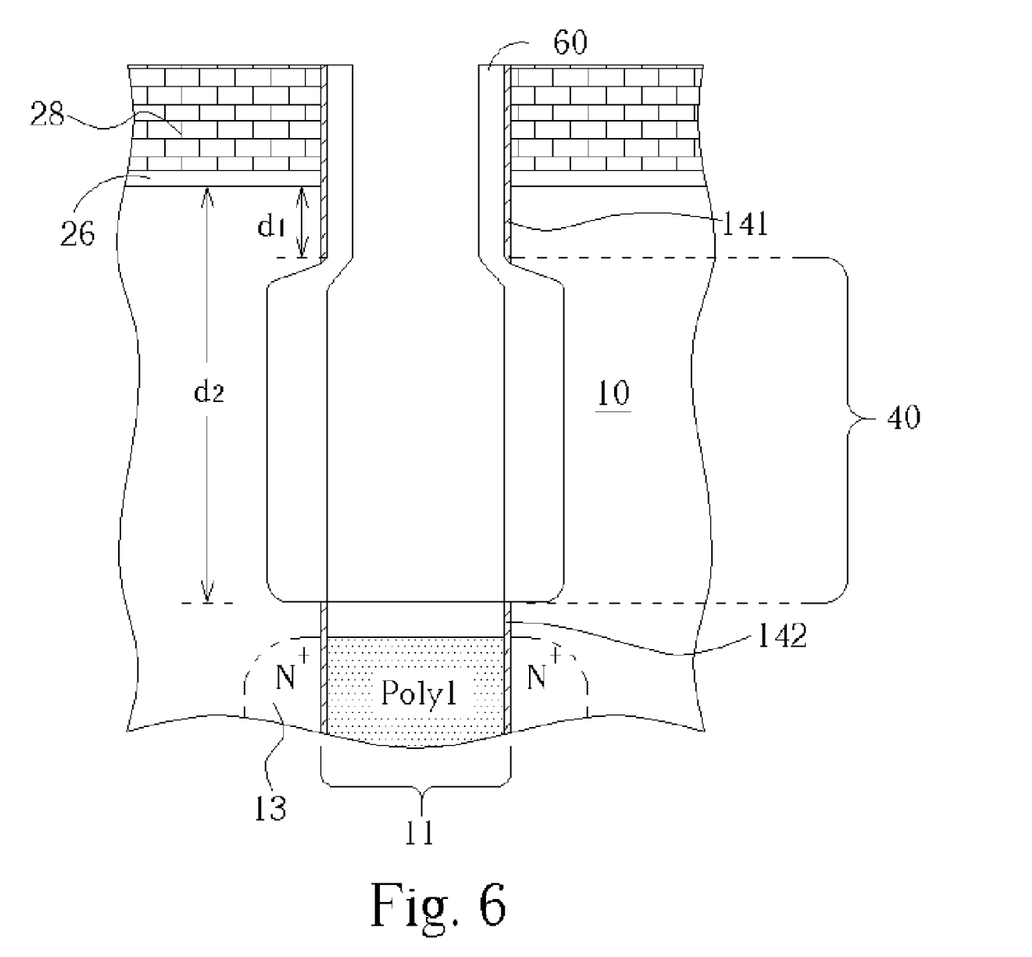

As shown in FIG. 6, an oxidation process such as wet oxidation or dry oxidation is performed to oxidize the silicon spacer 301 and the silicon surface at the neck portion 40, and the top surface of Poly1, thereby forming a silicon oxide layer 60 having a predetermined thickness such as 200~350 angstroms, preferably 300 angstroms.

Figure 7:
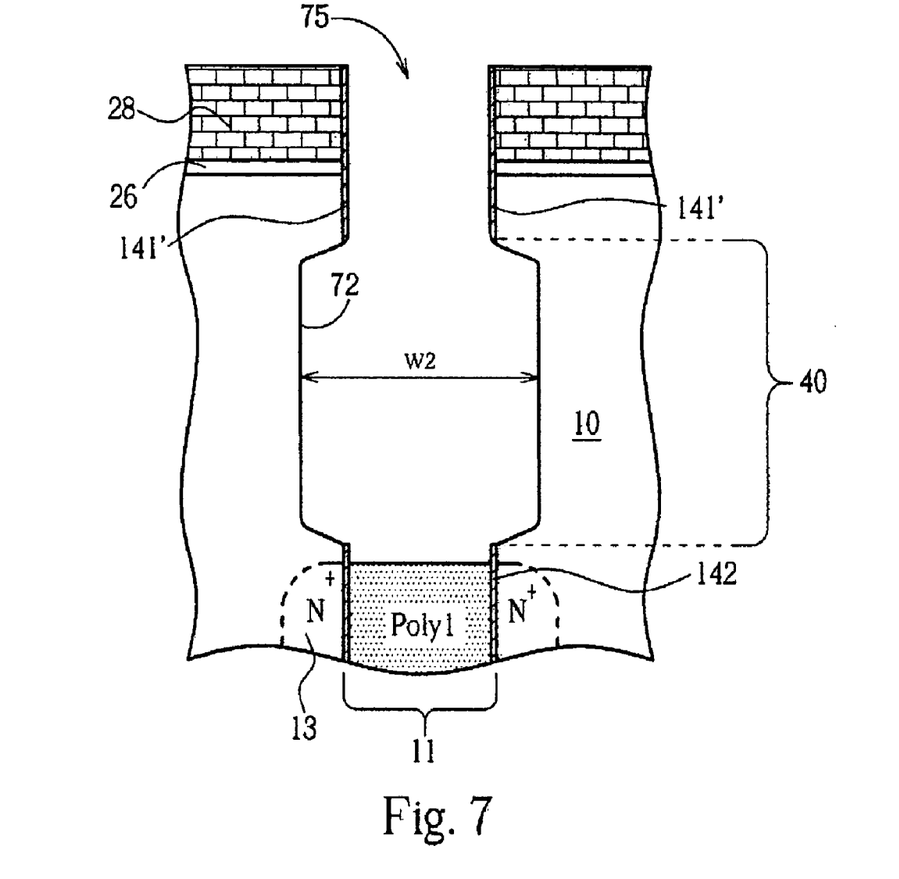

As shown in FIG. 7, a wet etching such as diluted HF is used to remove the silicon oxide layer 60 inside the deep trench 11, thereby forming a bottle-shaped expanded structure 75 having a width $w_2$ at the neck 40 of the deep trench 11. In accordance with the preferred embodiment of this invention, in a case that the node dielectric layer 14 is ONO dielectric, the upper dielectric section 141 now becomes nitride-oxide (NO) dielectric spacer 141'. It is one of the main features of the present invention that when wet etching the collar oxide layer 54, the pad oxide layer 26 around the top of the deep trench is protected by the upper section node dielectric 56.

Figure 8:
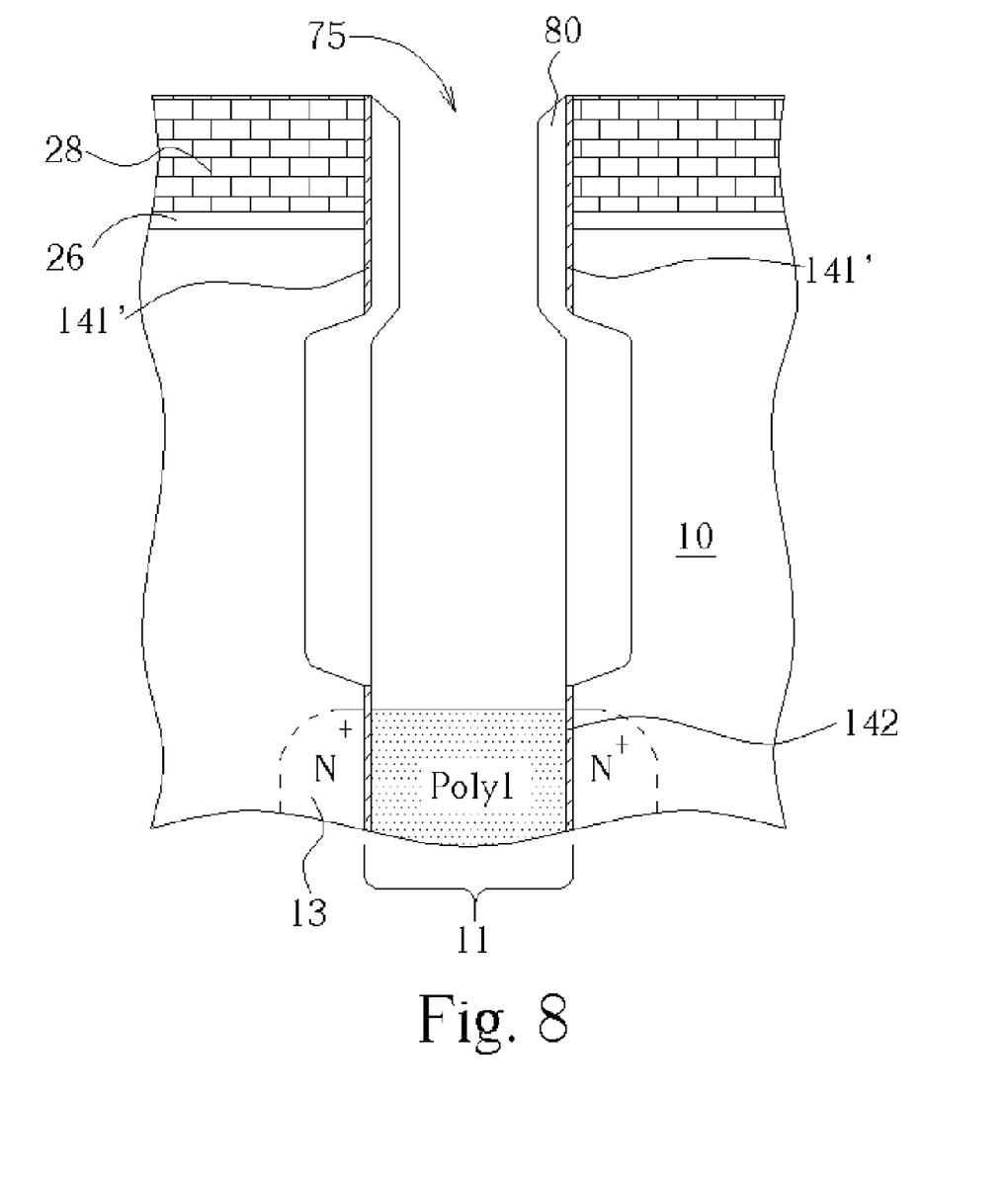

Next, as shown in FIG. 8, collar oxide formation begins. A CVD process is performed to deposit a conformal silicon dioxide layer on the interior surface of the deep trench 11. The conformal silicon dioxide layer covers the dielectric spacer 141', the recessed sidewall surface at the expanded neck 40 and the top surface of Poly1. A dry etching is then carded out to etch the conformal silicon dioxide layer, thereby forming a collar oxide layer 80. The dry etching stops when Poly1 is exposed.

Figure 9:
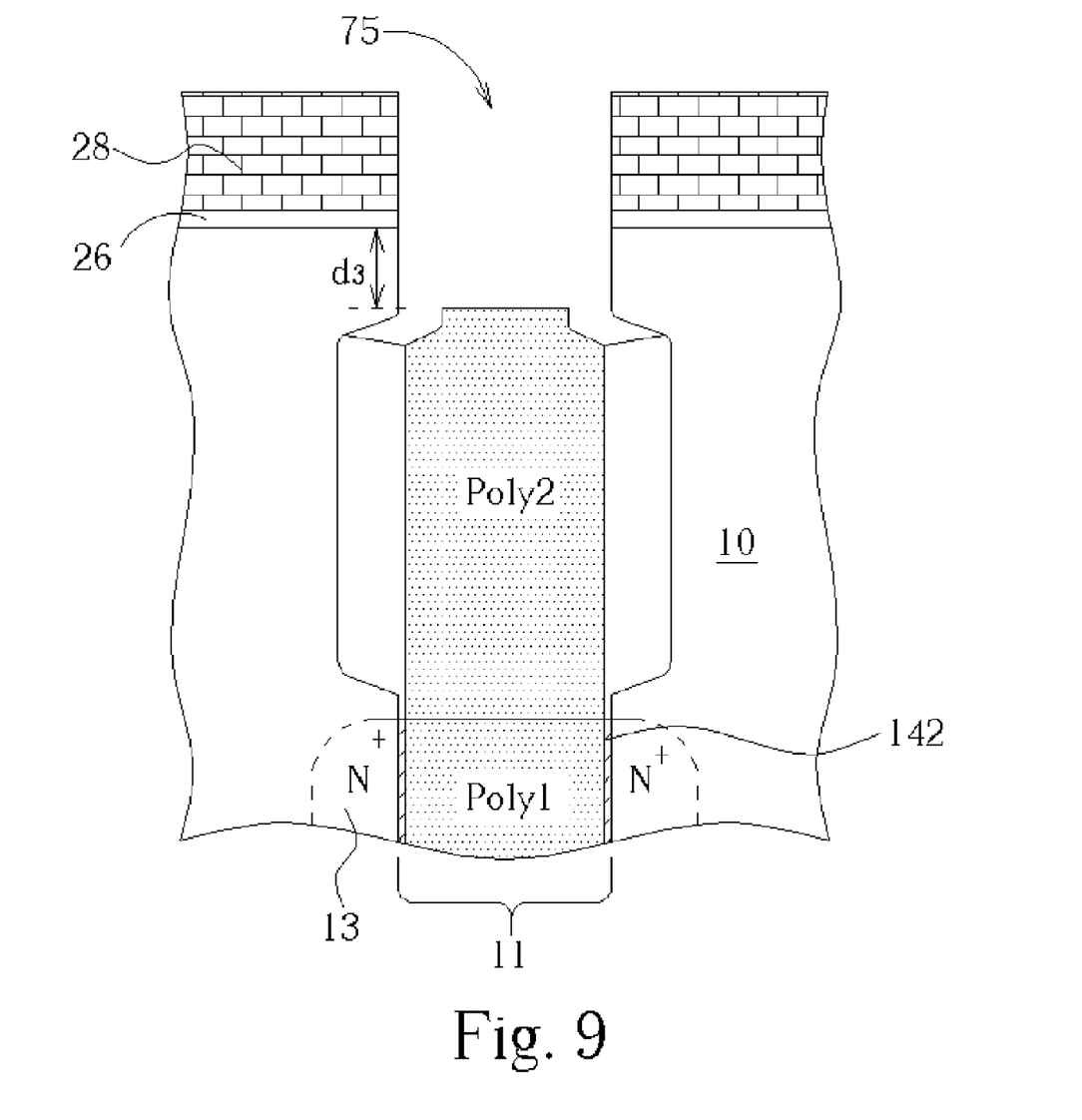

As shown in FIG. 9, a second polysilicon deposition and recess process is carried out to form a second polysilicon layer (Poly2) atop the first polysilicon layer (Poly1) inside the deep trench 11. The second polysilicon deposition and recess process includes the steps of filling the deep trench and the bottle-shaped structure with a layer of doped polysilicon, followed by etching back the doped polysilicon to a third depth $d_3$ below the main surface 11 of the substrate 10. According to the preferred embodiment of this invention, the third depth $d_3$ approximately equals to the first depth $d_1$. Thereafter, a wet etching such as diluted HF is used to remove the collar oxide layer 80 inside the deep trench 11, which is not covered by the second polysilicon layer (Poly2). The dielectric spacer 141' is then removed by wet etching.

Figure 10:
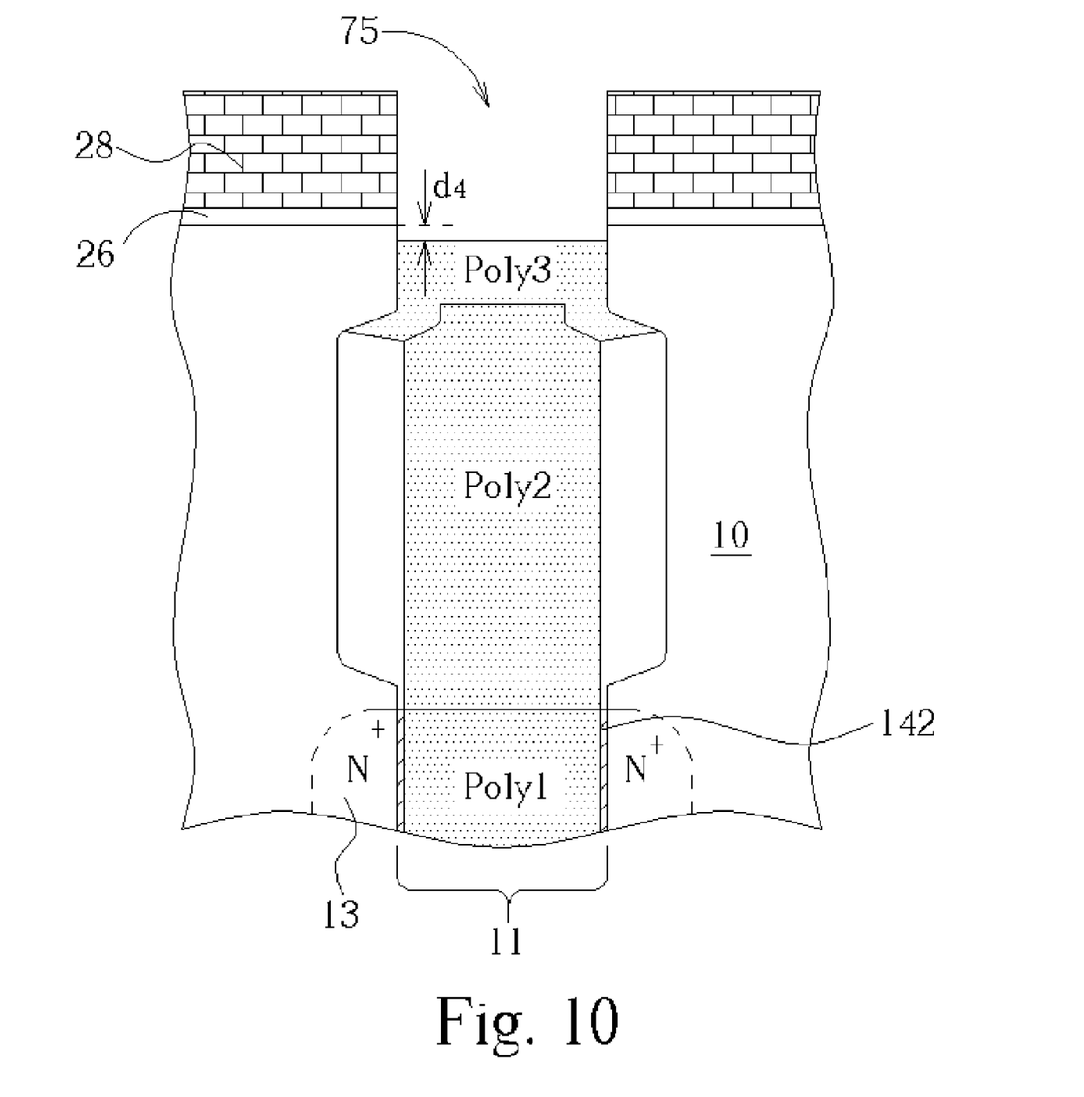

As shown in FIG. 10, A third polysilicon deposition and recess process is then carried out to form a third polysilicon layer (Poly3) atop the second polysilicon layer (Poly2) inside the deep trench 11. The third polysilicon layer (P3) is also referred to as a buried strap layer. The third polysilicon deposition and recess process includes the steps of filling the deep trench with a layer of non-doped polysilicon, followed by etching back the non-doped polysilicon to a fourth depth d4 of about 100~600 angstroms below the main surface of the substrate 10. After this, a standard STI module, which is not germane to this invention, is carried out.

To sum up, the present invention method may be summarized as following major steps:

1. deep trench 11 etching;
2. buried plate and capacitor dielectric (or node dielectric) forming;
3. Poly1 deep trench fill and first Poly1 recess etching;
4. silicon spacer layer 30 depositing;
5. second Poly1 recess etching;
6. node dielectric etching at deep trench neck 40;
7. oxidation at deep trench neck 40 and oxidation of silicon spacer layer 30;
8. silicon oxide layer 60 removing;

9. collar oxide 80 depositing and etching;
10. Poly 2 deep trench fill and Poly2 recess etching;
11. collar oxide wet etching;
12. Poly 3 deep trench fill and Poly3 recess etching; and
13. STI processing.

Those skilled in the art will readily observe that numerous modifications and alterations of the present invention may be made while retaining the teachings of the invention. Accordingly, the above disclosure should be construed as limited only by the metes and bounds of the appended claims.

What is claimed is:

1. A method for fabricating a trench capacitor of DRAM devices, comprising:
    providing a substrate having a deep trench etched therein;
    doping the deep trench to form a buried plate electrode in the substrate adjacent to a lower portion of the deep trench;
    forming a node dielectric layer on interior surface of the deep trench;
    depositing a first polysilicon layer in the deep trench;
    recessing the first polysilicon layer to a first depth $d_1$ in the deep trench, a top surface of the recessed first polysilicon layer and the node dielectric layer constituting a first recess;
    depositing a silicon spacer layer in the first recess;
    anistropic etching the silicon spacer layer and the first polysilicon layer inside the deep trench to a second depth $d_2$, wherein the remaining silicon spacer layer becomes a spacer;
    removing the node dielectric layer that is not covered by the spacer and the first polysilicon layer, thereby exposing a silicon surface at a neck portion of the deep trench,
    wherein the node dielectric layer is divided into an upper dielectric section and a lower dielectric section that serves as a capacitor dielectric of the trench capacitor;
    oxidizing the spacer, the silicon surface at the neck portion of the deep trench and an upper portion of the first polysilicon layer, thereby forming a silicon oxide layer; and
    etching away the silicon oxide layer.

2. The method of claim 1 wherein the substrate has a pad oxide layer and a pad nitride layer formed thereon.

3. The method of claim 1 wherein the node dielectric layer is oxide-nitride-oxide (ONO) dielectric.

4. The method of claim 1 wherein $d_1$ ranges between 200 and 500 angstroms.

5. The method of claim 1 wherein $d_2$ ranges between 800 and 1500 angstroms.

6. The method of claim 1 wherein the silicon spacer layer is made of amorphous silicon.

7. The method of claim 6 wherein the silicon spacer layer has a thickness of about 200~350 angstroms.

8. The method of claim 1 wherein after etching away the silicon oxide layer, the method further comprises the following steps:
    depositing a CVD oxide layer in the deep trench;
    etching back the CVD oxide layer to form a collar oxide layer;
    depositing a second polysilicon layer on the collar oxide layer in the deep trench;
    recess etching the second polysilicon layer to a third depth $d_3$;
    removing the collar oxide layer that is not covered by the second polysilicon layer; and
    removing the upper dielectric section.

9. The method of claim 8 wherein after removing the upper dielectric section, the method further comprises the following steps
    depositing a third polysilicon layer atop the second polysilicon layer in the deep trench; and
    recess etching the third polysilicon layer to a fourth depth $d_4$.

* * * * *